United States Patent [19]

Bowen et al.

[11] Patent Number: 5,483,422
[45] Date of Patent: Jan. 9, 1996

[54] KEYING CARD GUIDE FOR PC CARD

[75] Inventors: Michael K. Bowen; Matt G. Driggers, both of Vancouver, Wash.

[73] Assignee: Hewlett-Packard Company, Palo Alto, Calif.

[21] Appl. No.: 311,083

[22] Filed: Sep. 23, 1994

[51] Int. Cl.$^6$ .................................................. H05K 7/14
[52] U.S. Cl. ........................... 361/802; 361/752; 361/796; 235/486; 439/44
[58] Field of Search ...................................... 361/737, 748, 361/752, 741, 747, 752, 796, 756, 802; 174/266; 235/441, 486, 487, 492; 439/44

[56] References Cited

U.S. PATENT DOCUMENTS

| | | | |
|---|---|---|---|
| 4,887,188 | 12/1989 | Yoshida et al. | 361/413 |
| 5,155,663 | 10/1992 | Harase | 361/395 |

Primary Examiner—Leo P. Picard
Assistant Examiner—Y. Whang

[57] ABSTRACT

A guide mechanism prevents an improperly oriented PC card from being inserted a significant distance into a PC slot. A pair of PC card guide mechanisms are coupled to a PC male connector. A PC card is received at the guides as the card is inserted and pushed toward the male connector. Each guide mechanism includes a proximal end that engages an edge of the male connector, and a distal flanged end that receives the PC card. A guide rail extends between the proximal and distal ends of each guide mechanism. At least one guide mechanism includes a flexible arm along its guide rail. At the tip of the arm is a keying mechanism responsive to the PC card orientation. When the PC card is properly oriented, the card slides over the keying mechanism pushing it aside to traverse the guide rail. When the PC card is improperly oriented, the card is blocked by the keying mechanism so as not to traverse the guide rail. The inventive keying mechanism is located away from the male connector and toward the distal end of the guide mechanism. As a result, an installer feels resistance of an improperly oriented card before the card travels a significant distance within the slot. In particular, the installer receives tactile feedback by feeling the resistance and visible feedback by seeing that the card is not installed nearly as far as it should when a proper connection occurs. Automated ejection is not needed.

9 Claims, 5 Drawing Sheets

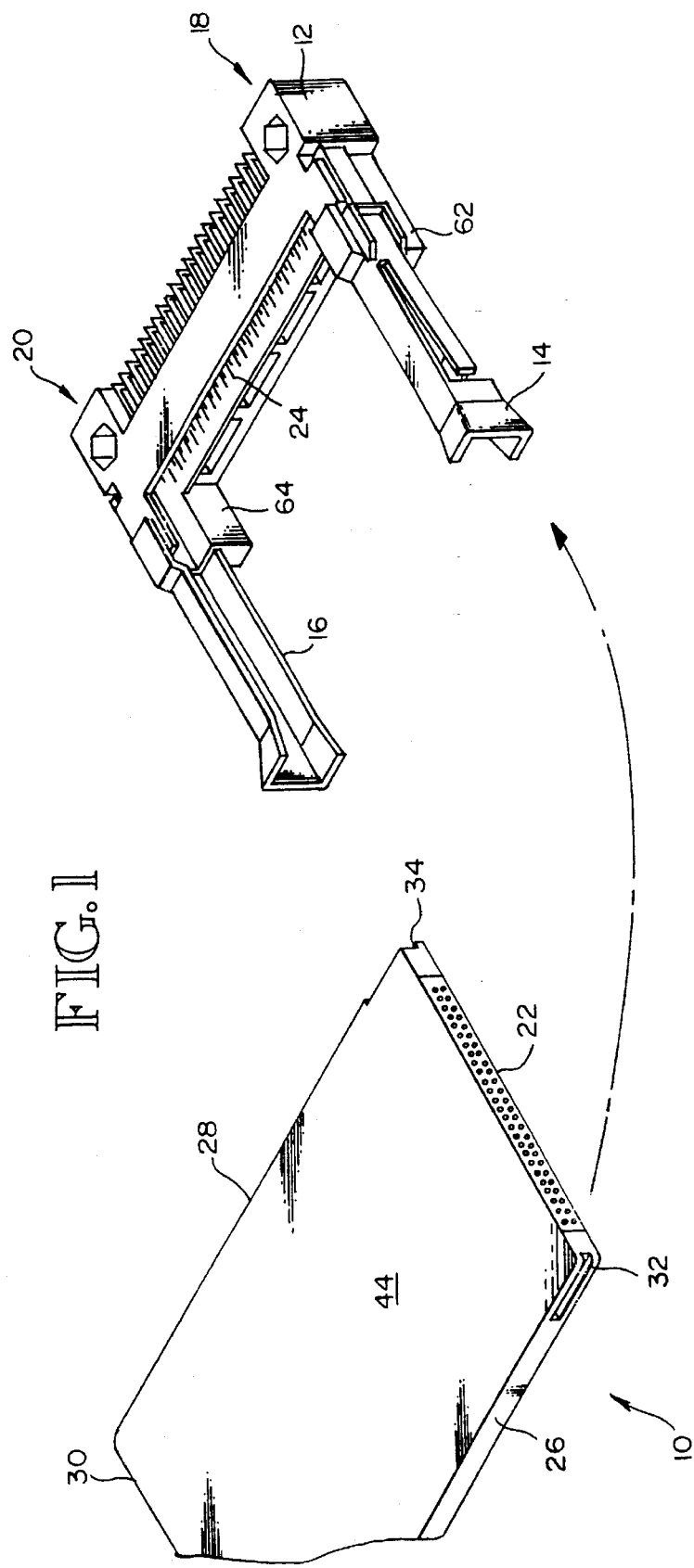

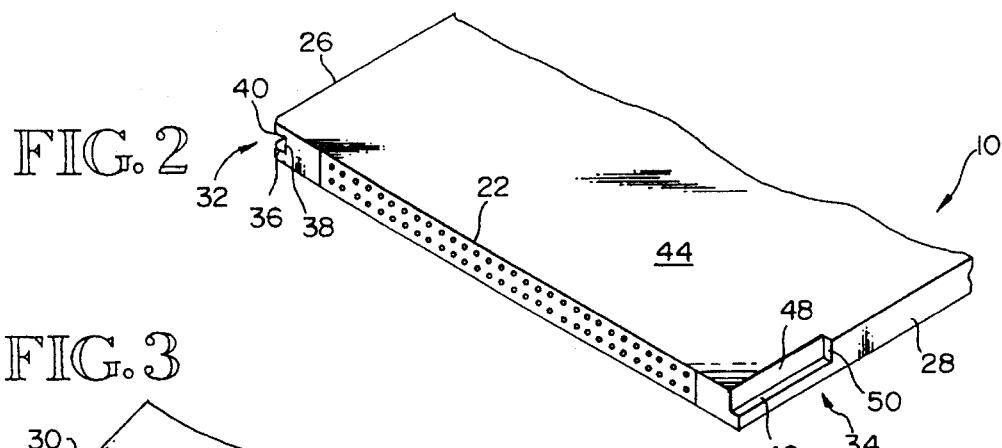
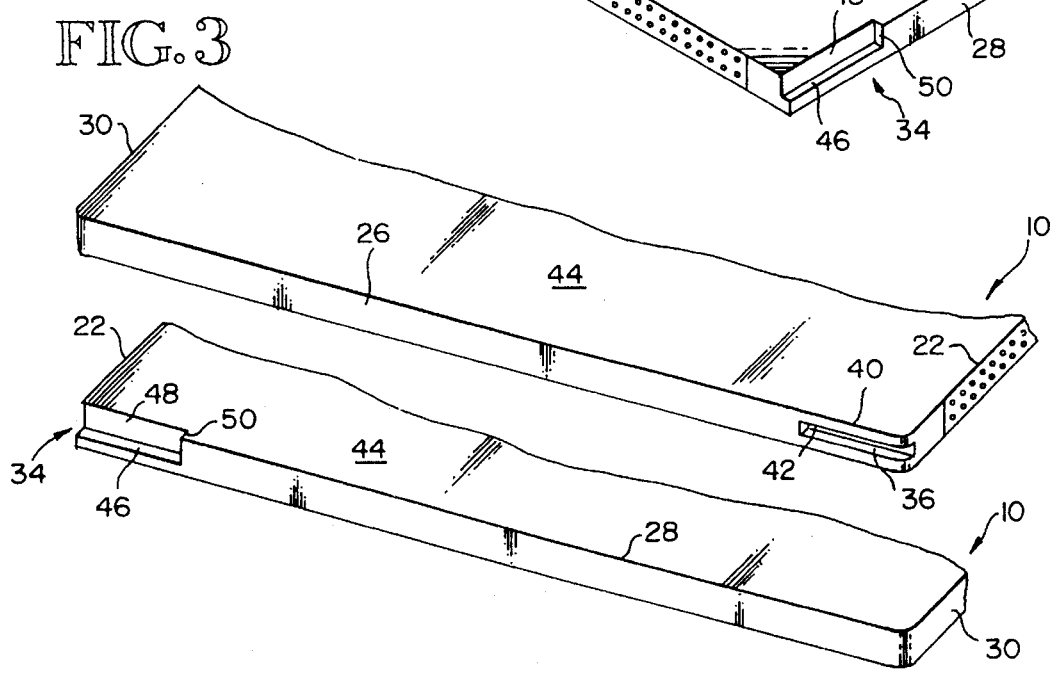
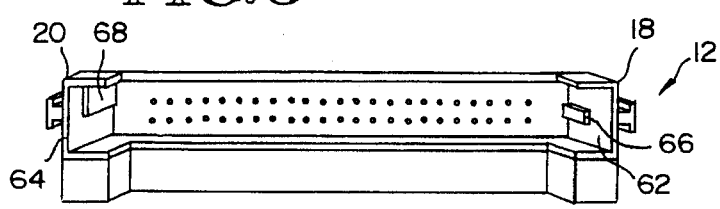
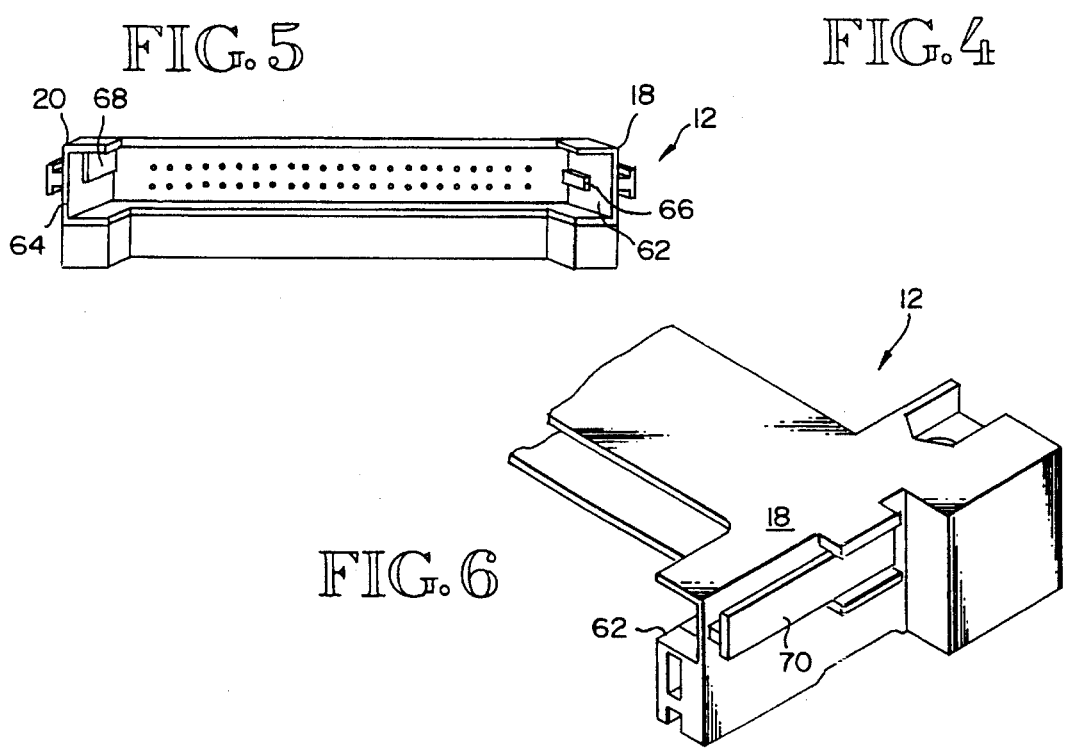
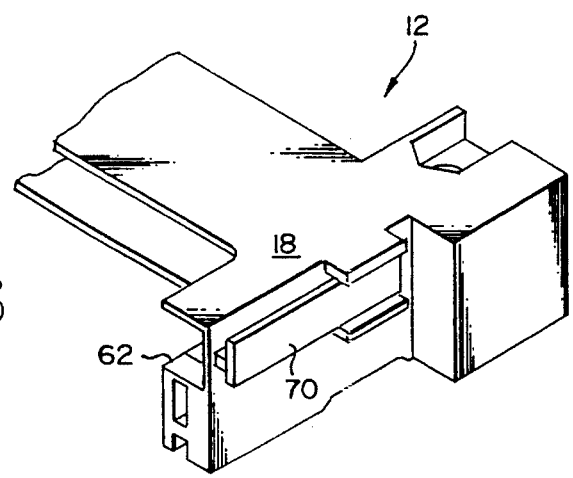

KEYING CARD GUIDE FOR PC CARD

BACKGROUND OF THE INVENTION

This invention relates to devices for guiding a PC card or the like into a card slot, and more particularly to a card guide providing tactile feedback of improper Pc card orientation.

The Personal computer Memory card International Association (PCMCIA) is a group of manufacturers and vendors formed to promote a common standard for personal computer-based peripherals, primarily on laptop, palmtop, and other portable computing devices. A Pc card is an add-in card that conforms to the PCMCIA specification. The Pc card is a removable device approximately the same size as a credit card (54 mm×85.6 mm) designed to plug into a PC connector. Release 1 of the PCMCIA specification, introduced in September 1990, specified a Type I card that is 3.3 mm thick. Type I cards are primarily memory-related peripherals, such as RAM, ROM, EEPROM, and flash memory. Other peripherals such as sound cards are also available as a Type I PC card. Release 2 of the PCMCIA specification, introduced in September 1991, specified a Type II card that is 5.0 mm thick, and a Type III card that is 10.5 mm thick. Type II cards accommodate devices such as a modem, fax, network interface, or sound card. Type III cards accommodate devices that require more space, such as a wireless communications device or a rotating storage media (e.g., hard disk). A revision of the PcMcIA standard is under consideration for a PC card 32, that may include support for a 32-bit bus interface, multifunction cards, and power management.

A conventional PC card includes a female connector which couples to a 68-pin male connector inside a PC slot. The male and female connectors are the same for Type I, Type II and Type III PC cards. Because, the card heights vary among types, however, Type I, Type II and Type III slots differ. In particular, the slot widths are the same but the slot heights differ. Typically, a Type I slot can accommodate only a Type I PC card. Typically, a Type II slot can accommodate only a Type II or a Type I PC card. A Type III slot can accommodate a Type III, Type II or a Type I PC card.

Because there are 68 PC card openings to be aligned with 68 PC connector pins, proper card orientation is needed during insertion. To align the card properly, grooves defined at the edges of the card and ridges defined at ends of the male connector form a keying structure. If, for example, the card is inserted upside down, then the grooves and ridges do not align preventing mating of the card openings and connector pins. An improper orientation can lead to improper connection and the potential for damaging the PC card or host device circuitry. Users may even try to force a card in a manner that damages the card, the connector pins or the card slot. Accordingly, there is a need for the installer to be able to detect when a PC card is improperly oriented.

Existing devices for signifying proper orientation of a PC card during insertion are categorized as electronic sensing devices or mechanical insertion prevention devices. In addition, magnetic sensing devices are useful for cards with a recorded stripe, (e.g., ATM card). Electronic and magnetic sensing devices typically determine whether a card is properly oriented only after the card is inserted fully within the slot out of the installer's grasp. Specifically, the sensing devices become active once the card is substantially inserted. Also, the circuitry for the sensing devices is relatively expensive and costly to manufacture. Further, electronic and magnetic sensing devices require that electrical power be available during the sensing operations. The expense, lack of immediate feedback, and power requirement are undesirable features. Accordingly, there is a need for less expensive, powerless devices providing immediate orientation feedback.

Mechanical insertion prevention devices typically are less costly than the electronic and mechanical sensor counterparts, and do not require power. The known mechanical devices, however, do not provide unequivocal, immediate, tactile or visible feedback of improper orientation. In slots in which the card is completely contained, ejection mechanisms are necessary, otherwise removal of the improperly oriented card is difficult. In slots in which a portion of the card protrudes during operation, the difference in position between a properly oriented card and an improperly oriented card is too small to clearly indicate that the card is improperly oriented. Accordingly, there still is a need for an inexpensive mechanical device providing immediate tactile and visible feedback of card orientation.

SUMMARY OF THE INVENTION

According to the invention, card guides prevent an improperly oriented PC card or the like from being inserted a significant distance into a corresponding card slot. The installer receives immediate tactile and visible feedback on whether a PC card is improperly oriented. In particular, the improperly oriented PC card can be inserted only a small distance before it is apparent that the card is not fitting. Tactile feedback occurs soon enough that the installer knows of the problem before removing their grip on the card.

According to one aspect of the invention, a pair of card guides are coupled to a PC male connector. The connector has a standard width and a standard height defining left and right ends and top and bottom edges. The PC card guides are removably coupled to the left and right ends, respectively, of the connector. A PC card is received into the guides as the card is inserted and pushed toward the PC male connector. Immediate feedback of an improperly oriented PC card occurs. It is expected that the card is still in the inserter's grasp. Because the card is not inserted all the way, the installer can readily remove the improperly oriented card. Automatic ejection is not needed. One advantage of this aspect is that a less expensive PC slot, omitting an ejection mechanism, is achieved.

According to another aspect of the invention, each card guide includes a proximal end that engages an end of the PC male connector and a distal flanged end that receives the PC card. A guide rail connects the proximal and distal ends of a respective guide mechanism. Because all PC cards have the same height at its card edges, all PC cards fit the guide rails. A PC card is fed female connector edge first into a PC slot fitted with the guide mechanisms. The card edges perpendicular to the female connector edge are received at the guide rails. The card first encounters the flanged end of the guide mechanisms which directs the card to the guide rails. A properly oriented card is freely pushed along the guide rails to a conventional keying mechanism at the PC connector. As the card is inserted, the rails, then the conventional keying mechanism, align the card. As the card edge approaches the connector pins, the conventional keying mechanism assures proper alignment and mating.

According to another aspect of the invention, at least one guide mechanism includes a flexible arm along its guide rail. At the tip of the arm is a keying mechanism of this invention responsive to the PC card orientation. When the PC card is properly oriented, the card slides over the keying mechanism pushing it aside to traverse the guide rail. When the card is improperly oriented, the PC card is blocked by the keying mechanism so as not to traverse the guide rail.

According to another aspect of the invention, the inventive keying mechanism is located away from the male connector and toward the distal end of the guide mechanism. As a result, an installer feels resistance of an improperly oriented card before the card travels a significant distance within the slot. In particular, the installer has tactile feedback by feeling the resistance, and visible feedback by seeing that the card is not installed nearly as far as it should when a proper connection occurs. With a significant length of the card protruding from the slot, the card is easily grasped and removed.

One advantage of the invention is that feedback occurs soon enough during the installation motion to block the normal progress and allow easy removal without the need of an ejection mechanism. Another advantage is that the mechanical blocking provides feedback at a significantly lesser cost than electronic and magnetic sensing devices used for similar objectives. Another advantage is that the computing or peripheral device hosting the PC card need not be powered on for proper feedback to occur. The card guides are mechanical mechanisms which do not require electronic power inputs.

The invention will be better understood by reference to the following detailed description taken in conjunction with the accompanying drawings.

BRIEF DESCRIPTION OF THE DRAWINGS

FIG. 1 is a perspective view of a conventional Type I PC card, along with guide mechanisms coupled to a PC connector according to an embodiment of this invention;

FIG. 2 is a perspective view of a first edge of the PC card of FIG. 1;

FIG. 3 is a perspective view of a second edge of the PC card of FIG. 1;

FIG. 4 is a perspective view of a third edge of the PC card of FIG. 1;

FIG. 5 Is a perspective view of the PC connector of FIG. 1;

FIG. 6 is a partial perspective view of the PC connector of FIG. 1;

DESCRIPTION OF SPECIFIC EMBODIMENTS

Overview

Figure 7:
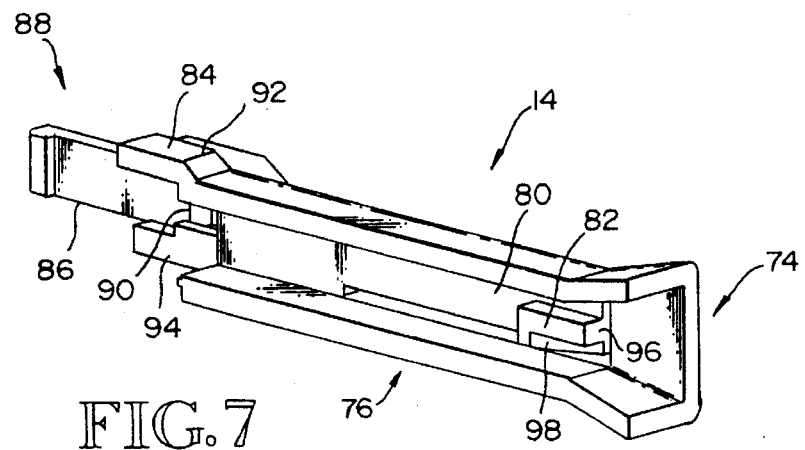
FIG. 7 is a perspective view of a first guide mechanism according to an embodiment of this invention.
Figure 8:
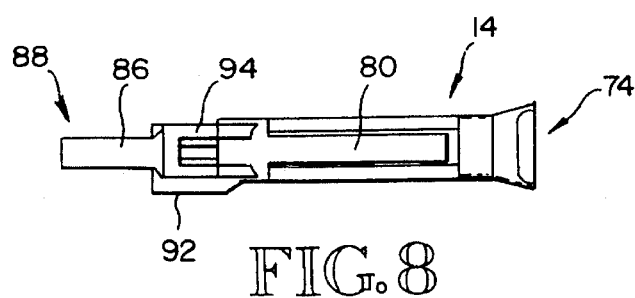
FIG. 8 is a plane view of the guide mechanism of FIG. 7.
Figure 9:
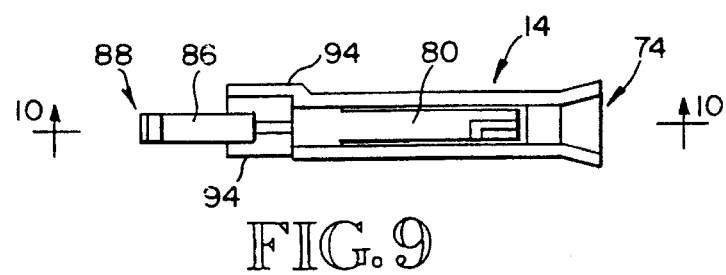
FIG. 9 is another plane view of the guide mechanism of FIG. 7.
Figure 10:
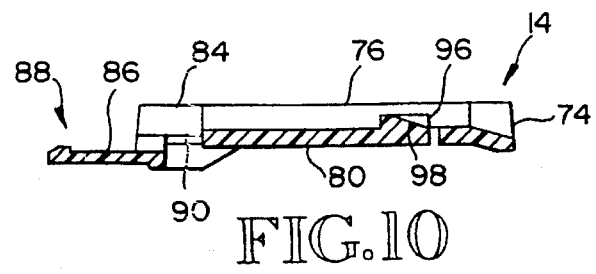
FIG. 10 is a sectional view of the guide mechanism of FIG. 7.
Figure 11:
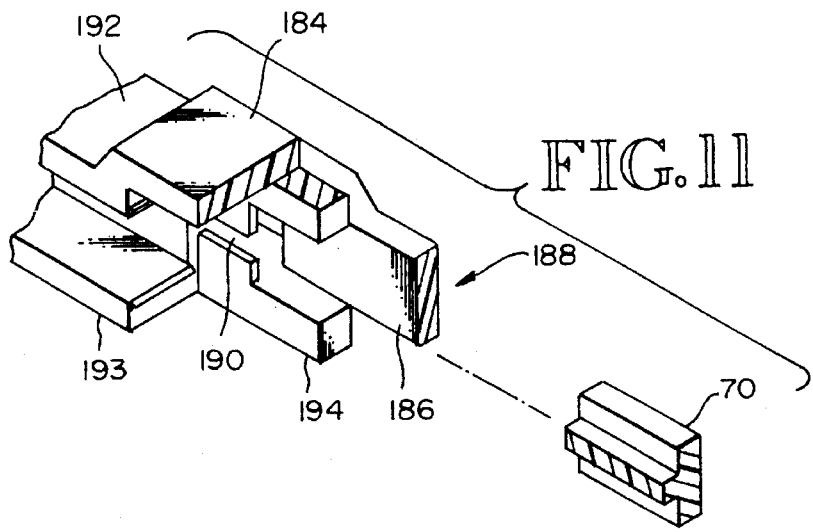
FIG. 11 is a partial sectional perspective view of the guide mechanism of FIG. 7 and engaging rail of FIG. 1.
Figure 12:
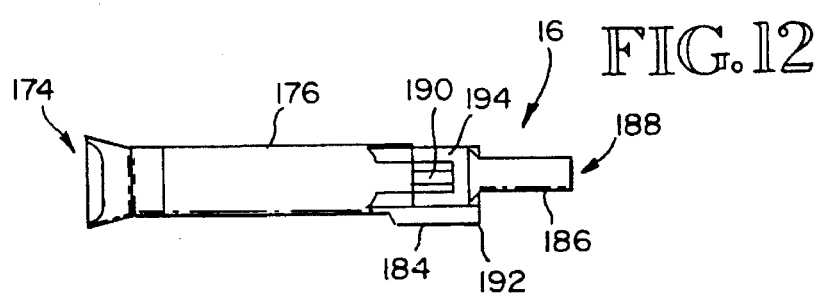
FIG. 12 is a plane view of a second guide mechanism according to an embodiment of this invention.
Figure 13:
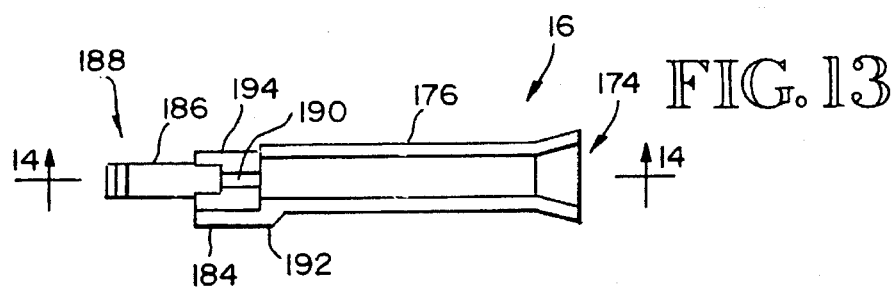
FIG. 13 is another plane view of the second guide mechanism according to an embodiment of this invention.
Figure 14:
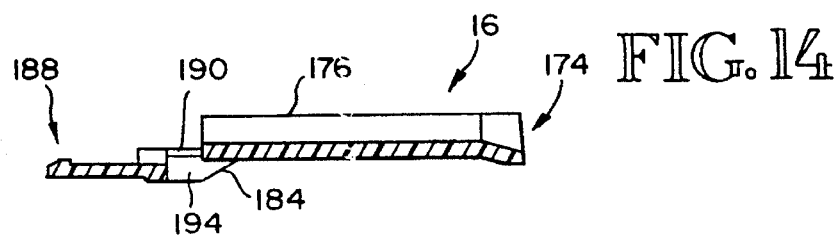
FIG. 14 is a sectional view of the second guide mechanism according to an embodiment of this invention.

FIG. 1 shows a perspective view of a PC card 10, PC male connector 12 and card guide mechanisms 14, 16 according to an embodiment of this invention. The PC card 10 embodies an electronic circuit coupled to a host computer or other electronic device through the PC male connector 12. The card guides 14, 16 removably engage the connector 12 at opposing connector ends 18, 20. The card guides 14, 16 receive the PC card 10 as the card 10 is inserted into a slot containing the card guides 14, 16 and connector 12. The card guides 14, 16 serve as rails along which the card 10 is moved. At least one card guide 14 includes a keying mechanism 82 (see FIG. 7) to allow passage of a properly oriented PC card 10, and to resist passage of an improperly oriented PC card 10.

PC Card and Card Orientations

FIGS. 1–4 show a Type I PC card. According to industry standards, a Type I card has a width of 54 mm, a length of 85.6 mm and a height of 3.3 mm. A first edge 22 corresponding to the card width defines a female connector having 68 openings for mating with 68 pins 24 of the male connector 12. Second and third edges 26, 28 corresponding to the card length run perpendicular to the first edge 22. A fourth edge 30 corresponding to the card width is opposite the first edge 22. The first and fourth edges are 54 mm by 3.3 mm. The second and third edges are 85.6 mm by 3.3 mm. A Type II or Type III PC card has the same 54 mm width and 85.6 mm length, but a greater height—(i.e., Type II is 5.0 mm; Type III is 10.5 mm). The four edges, however, regardless of whether a Type I, Type II or Type III card have the same 3.3 mm height. Thus, the first and fourth edges 22 and 30 have the same dimensions regardless of which type of PC card. Similarly, the second and third edges 26, 28 have the same dimensions regardless of which type of PC card.

According to industry standards, a first elongated groove 32 is defined at the second edge 26 of card 10 to extend from the first edge 22 toward the fourth edge 30 for approximately 11 mm. Also, a second elongated groove 34 is defined at the third edge 28 to extend from the first edge 22 toward the fourth edge 30 for approximately 11 mm. Each groove 32, 34 is approximately 1.5 mm deep. The first groove 32 is open on two sides, one at edge 22 and one at edge 26. The second groove 34 is open on three sides, one at edge 22, one at edge 28 and one at card face 44. The first groove 32 is defined by three walls 36, 38, 40 extending from edge 22 along edge 26 to end at a fourth wall 42. The second groove 34 is defined by two walls 46, 48 extending from edge 22 along edge 28 to end at a third wall 50.

When inserting a PC card 10 into a PC card slot, the card 10 can be oriented in any of four ways. According to a first orientation and a second orientation, the edge 22 which defines a female connector is inserted first. According to a third orientation and a fourth orientation, the edge 30 is inserted first. A user can readily see that the female connector at edge 22 should be inserted first, so incorrectly inserting a card according to the third or fourth orientations is less common. Determining whether the first or second orientation is correct requires closer inspection by the user. According to the first orientation (see FIG. 1), face 44 is up so that the first groove 32 is inserted at connector end 18, and the second groove 34 is inserted at connector end 20. According to the second orientation, face 44 is down so that the first groove 32 is inserted at connector end 20, and the second groove 34 is inserted at connector end 18. As described in the section on "PC Card Installation," the first orientation is correct, while the second, third and fourth orientations are incorrect.

PC Male Connector

FIGS. 1, 5 and 6 show a PC male connector 12. According to industry standards, the connector 12 includes 68 pins for mating with the 68 openings at the PC card edge 22. According to conventional design, the male connector 12 receives the card 10 at connector rails 62, 64. One connector rail 62 extends outward at connector end 18, while the other connector rail 64 extends outward at connector end 20. Each connector rail 62, 64 defines a conventional keying mechanism to prevent the card 10 from making an electrical connection when improperly oriented. One connector rail 62 defines a first ridge 66 (see FIG. 5) which aligns with the first groove 32 (see FIGS. 1 and 3) of the card 10. The other connector rail 64 defines a second ridge 68 (see FIG. 5) which aligns with the second groove 34 (see FIGS. 1 and 4) of the card 10. When a PC card is properly oriented, the connector ridges 66, 68 align with the card grooves 32, 34 allowing the card 10 to form an electrical connection with PC male connector 12. When a PC card is improperly aligned according to the second orientation, ridge 68 does not key into groove 32. Instead, ridge 68 blocks the card 10 from being completely inserted. When a PC card is improperly aligned according to the third or fourth orientations, both ridges 66, 68 have no grooves to key into. Thus, the connector ridges 66, 68 prevent the card 10 from being inserted. Without the conventional keying, installation according to the third or fourth orientations could bend and/or damage the connector pins 24. Installation according to the second orientation could cause the wrong pin to mate with the wrong opening. Such improper mating could damage the PC card or the host device's electronic circuits.

Although the conventional keying mechanisms at the connector 12 prevent improper connection, they do not provide immediate and unequivocal feedback of an improperly orientated card. The positional difference between a proper and improperly inserted card is about 10 mm. A user may not note the lack of proper mating, then subsequently experience a non-operating PC card without readily attributing the problem to the lack of a connection.

According to an embodiment of this invention, card guide mechanisms 14, 16 (See FIG. 1) are coupled to the connector 12 to define an additional keying mechanism which exaggerates the positional difference between a properly oriented and an improperly oriented PC card.

Card Guides

FIG. 1 and FIGS. 7–11 show a first guide mechanism 14, while FIG. 1 and FIGS. 12–14 show a second guide mechanism 16. The first guide 14 includes a flanged distal end 74, a guide rail 76, a movable first cantilever arm 80, a keying guide mechanism 82, a support 84, a locking second arm 86, and a proximal end 88. The PC card 10 is received at the distal end 74. Flanging of the distal end 74 increases the opening for receiving the card 10 and biases the card 10 toward the guide rail 76. During insertion, the card 10 is pushed along the guide rail 76 toward the guide mechanism's proximal end 88.

The first arm 80 forms a wall of the rail 76 and extends from a fixed end near the first guide's proximal end 88 to a free end near the first guide's distal end 74. The keying guide 82 is formed at the first arm's free end to resist passage of an improperly oriented card 10. The keying guide 82 defines a blocking surface 96 and an inclined surface 98.

In one embodiment the first guide 14 is removably attached to the connector 12 at the guide's proximal end 88. The attachment is characterized by a locking arm 86, an engaging rail 70 and a flush support 84. The locking arm 86 and support 84 are part of the first guide mechanism 14. The engaging rail 70 is part of the PC connector 12. Referring to FIG. 6, the male connector 12 includes an engaging rail structure 70 at connector end 18 and connector end 20 (not shown). Each engaging rail 70 runs along the outer edge of the respective connector rails 62, 64.

The locking arm 86 (see FIG. 7) is pushed over the engaging rail 70 (see FIG. 6) as the rail 70 is received into a slot 90 at the base of the locking arm 86. The locking arm 86 extends beyond the engaging rail 70 to hook to a far side of the engaging rail 70. In one embodiment, the engaging rail 70 is attached to the connector rail 62 along its entire length to maintain a constant position after repeated guide 14 installations. A cross-section of the engaging rail 70 in one embodiment is T-shaped. Correspondingly, the first guide 14 defines a T-shaped slot for receiving the engaging rail 70.

When an attachment is formed, the guide rail 76 abuts the connector rail 62. A support 84 extends beyond the guide rail 76 along two walls 92, 94 common to the guide rail 76 to surround two exterior walls of the connector rail 62. The slot 90 is formed in one wall 94 and receives the engaging rail 70.

The second guide 16 includes a flanged distal end 174, a guide rail 176, a support 184, and a locking second arm 186, and a proximal end 188. The PC card 10 is received at the distal end 174. Flanging of the distal end 174 increases the opening for receiving the card 10 and biases the card 10 toward the guide rail 176. During insertion, the card 10 is pushed along the guide rail 176 toward the second guide mechanism's proximal end 188.

In one embodiment the second guide 16 is removably attached to the connector 12 at the guide's proximal end 188. The attachment is characterized by a locking arm 186, an engaging rail 70 and a flush support 184. The locking arm 186 and support 184 are part of the second guide mechanism 16. The engaging rail 70 is part of the PC connector 12.

The locking arm 186 (see FIG. 13) is pushed over the engaging rail 70 (like in FIG. 6) as the engaging rail 70 is received into a slot 190 at the base of the locking arm 186. The locking arm 186 extends beyond the engaging rail 70 to hook to a far side of the engaging rail 70. In one embodiment the engaging rail 70 is attached to the connector rail 62 along its entire length to maintain a constant position after repeated guide 16 installations. A cross-section of the engaging rail 70 in one embodiment is T-shaped. (See FIG. 11). Correspondingly, the second guide 16 defines a T-shaped slot 190 for receiving the engaging rail 70. (See FIG. 11)

When an attachment is formed, the guide rail 176 abuts the connector rail 64. A support 184 extends beyond the guide rail 176 along two walls 192, 193 of the three walls 192–194 common to the guide rail 176 to surround two exterior walls of the connector rail 64. The slot 190 is formed in one wall 193 and receives the engaging rail 70.

PC Card Installation

Figure 15:
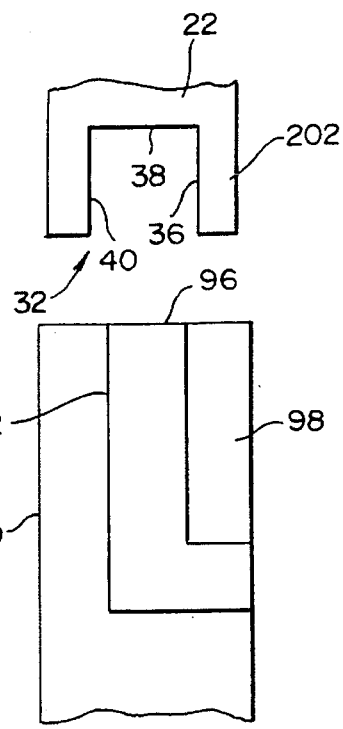
FIG. 15 is a block diagram showing the relation between the keying guide on the guide mechanism of FIG. 7 and a first groove on the PC card of FIG. 1.

Referring to FIG. 1 and FIG. 15, a PC card 10 having a first orientation is inserted into a PC slot including PC connector 12 and first and second card guides 14, 16. As the card 10 progresses along the guide rails 76, 176, the keying mechanism 82 is encountered at arm 80 of the first guide 14. Because the card 10 is at its first orientation, the card's first groove 32 aligns with the keying mechanism 82. As shown in FIG. 15, the first groove 32 includes a wall 36. A portion 202 of the wall 36 encounters the inclined surface 98 of the keying mechanism 82. As the card 10 is pushed further, the portion 202 of the card pushes at the inclined surface 98 to cantilever the arm 80 out of the path of the card 10. The card 10, therefore can be fully inserted to the connector 12 for operation. When the card is removed, the arm 80 returned to its unbiased position in which the keying mechanism 82 is in the card path.

Figure 16:
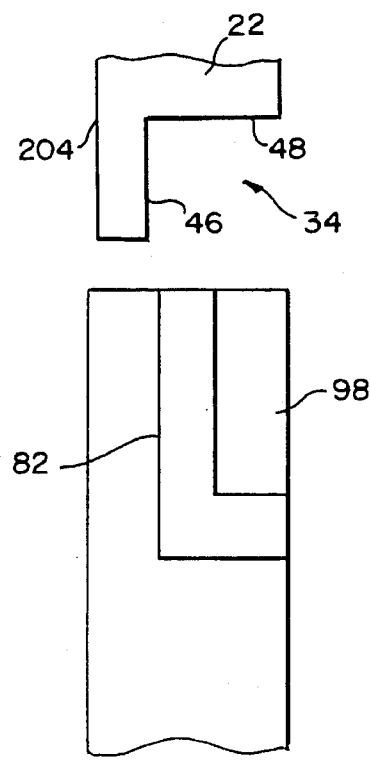
FIG. 16 is a block diagram showing the relation between the keying guide on the guide mechanism of FIG. 7 and a second groove on the PC card of FIG. 1.
Figure 17:
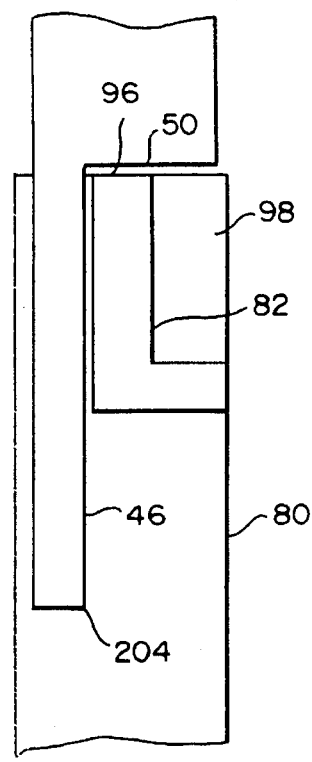
FIG. 17 is another block diagram showing the relation between the keying guide on the guide mechanism of FIG. 7 and the second groove on the PC card of FIG. 1.

Referring to FIGS. 16 and 17, a PC card 10 having a second orientation is inserted into a PC slot, including a PC connector 12 and first and second card guides 14, 16. As the card 10 progresses along the guide rails 76, 176, the keying mechanism 82 is encountered at arm 80 of the first guide 14. Because the card 10 is at the second orientation, the second card groove 34 aligns with the keying mechanism 82. As shown in FIG. 16, the second groove 32 includes a wall 46. A portion 204 of the wall 46 passes freely past the keying mechanism 82 along guide rail 76. As the card 10 progresses, however, the end wall 50 of the second groove 34 encounters the blocking surface 96 of the keying mechanism (see FIG. 17). The blocking wall 96 and groove end wall 50 are parallel and abut face to face. There is no wall at groove 34 to encounter the inclined surface 98 of the keying mechanism 82. Thus, the keying mechanism 82 resists further advancement of the card 10. Such resistance is tactile feedback to the inserter that the card is improperly oriented. The inserter also can see that the card 10 is protruding substantially more than if a proper connection is made. The noticeable difference in position is visual feedback that the card 10 is improperly oriented. Because the keying mechanism 82 is located toward the distal end 74 of the card guide 14, the resistance occurs relatively early in the insertion process. This provides the inserter with immediate feedback to remove the card before pushing further.

Alternative Embodiments

According to an alternative embodiment, the arm 80 carrying the keying mechanism 82 may vary in length and position. The keying mechanism 82, preferably is away from the proximal end 88 of the guide 14 to block an improperly oriented card a noticeable distance preceding the male connector 12. The arm 80 is biased into the card path along the guide rail 76. In the illustrated embodiment, the material forming the arm defines the bias. In alternative embodiment, a spring or other bias creating structure is included to bias the arm 80 into the card path.

According to the illustrated embodiments, the guide rails 76, 176 are formed by three walls surrounding an edge of a received PC card. In other embodiments, the guide rails 76, 176 are formed by one or two flat or curved walls.

According to the illustrated embodiments, the locking arm 86, slot 90 and engaging rail 70 define one manner of removably attaching the first guide mechanism 14 to the male connector 12. Similarly, the locking arm 186, slot 190 and engaging rail 70 define one manner of attaching the second guide mechanism 16 to the male connector 12. Alternative structures for permanently or removably coupling the guide mechanisms 14, 16 to the male connector 12 also may be implemented. For example, the guide rails can be molded with the male connector so as to avoid the need of engaging parts. Also, one skilled in the arts of fastening devices would appreciate the numerous ways to removably attach a guide mechanism 14, 16 to a male connector 12.

Meritorious and Advantageous Effects

One meritorious and advantageous effect of the invention is that feedback occurs soon enough during the installation motion to block the normal progress and allow easy removal of the PC card without the need of an ejection mechanism. Another advantage is that the mechanical blocking performed by the keying mechanism 82 provides feedback at a significantly lesser cost than electronic and magnetic sensing devices used for similar objectives. Another advantage is that a computing or peripheral device hosting the PC slot need not be powered on for proper feedback to occur. The card guides 14, 16 are mechanical mechanisms which do not require electronic power inputs.

Although a preferred embodiment of the invention has been illustrated and described, various alternatives, modifications and equivalents may be used. For example, although the card guide is described for use with a Type I, II, or III PC card and PC connector, future PC card/connector types (e.g., PC card 32) and current or future PC-like cards having keying grooves and corresponding connectors also are contemplated. Integrated circuit cards, including (i) Type I, Type II or Type III PC cards; (ii) cards complying with revised or future PC card-type specifications; (iii) portable encased electronic circuit cards having a connector for engaging a host device in which a groove is formed near at least one end of the card's connector to aid in alignment and to prevent engaging a mis-oriented card to a host connector and (iv) equivalents are encompassed. Correspondingly, integrated circuit connectors are contemplated for receiving the PC and PC-like cards and defining a structure related to the card's groove to aid in alignment and prevent engagement by a mis-oriented card. The precise physical dimensions and the number of pins/openings for a card or connector vary according to alternative embodiments. Therefore, the foregoing description should not be taken as limiting the scope of the inventions which are defined by the appended claims.

What is claimed is:

1. A guide apparatus at an integrated circuit connector for receiving an integrated circuit card, the integrated circuit card having a first edge for mating with the integrated circuit connector, a first end of the first edge defining a first groove that runs from the first edge along a perpendicular second edge, the guide apparatus comprising:

a first rail having a proximal end at the integrated circuit connector and a distal end for receiving the integrated circuit card; and a keying guide positioned away from the proximal end of the first rail in alignment with the first groove of a received integrated circuit card when the integrated circuit card has a first orientation, wherein the keying guide is movable out of the path of the integrated circuit card when the received integrated circuit card has the first orientation, and wherein the keying guide resists movement out of the path of the integrated circuit card when the received integrated circuit card has other than the first orientation.

2. The guide apparatus of claim 1, further comprising a second rail having a proximal end at the integrated circuit connector and a distal end for receiving the integrated circuit card.

3. The guide apparatus of claim 1, in which the first rail removably engages the integrated circuit connector.

4. A guide apparatus at an integrated circuit connector for receiving an integrated circuit card, the integrated circuit card having a first edge for mating with the integrated circuit connector, a first end of the first edge defining a first groove that runs from the first edge along a perpendicular second edge, the guide apparatus comprising:

a first rail having a proximal end at the integrated circuit connector and a distal end for receiving the integrated circuit card; and a keying guide positioned away from the proximal end of the first rail in alignment with the first groove of a received integrated circuit card when the card has a first orientation in which the keying guide is formed at an arm and comprises: a blocking surface in alignment with the first groove of a received integrated circuit card during insertion of the integrated circuit card at the first orientation, and an inclined surface adjacent to the blocking surface, the integrated circuit card at the first orientation encountering the inclined surface to push the arm out of the integrated circuit card path during insertion.

5. The guide apparatus of claim 4, wherein the integrated circuit card at other than the first orientation does not encounter the inclined surface, the blocking surface resisting advancement of the integrated circuit card.

6. A guide apparatus at a integrated circuit connector for receiving a integrated circuit card, the integrated circuit card having a first edge for mating with the integrated circuit connector, a first end of the first edge defining a first groove that runs from the first edge along a perpendicular second edge, comprising:

a first rail having a proximal end for removably engaging the integrated circuit connector and having a flanged distal end for receiving a integrated circuit card;

a movable arm positioned along the first rail;

a keying guide positioned at a distal end of the arm toward the distal end of the first rail, the keying guide comprising: a blocking surface in alignment with the first groove of at the received integrated circuit card having a first orientation, and an inclined surface adjacent to the blocking surface, the integrated circuit card at a first orientation encountering the inclined surface to push the arm out of the integrated circuit card path during insertion.

7. The guide apparatus of claim 6, wherein the integrated circuit card at other than the first orientation does not encounter the inclined surface, the blocking surface resisting advancement of the integrated circuit card at other than the first orientation.

8. The guide apparatus of claim 6, further comprising a second rail having a proximal end at the integrated circuit connector and a flanged distal end.

9. The guide apparatus of claim 6, in which the first groove is further defined by a first wall, a second wall and a third wall extending from the first edge along the perpendicular second edge.

* * * * *